United States Patent
Sandnes et al.

(10) Patent No.: US 12,156,354 B2
(45) Date of Patent: Nov. 26, 2024

(54) DOOR FOR MOUNTING A REMOVABLE ELECTRONIC DISPLAY

(71) Applicant: Anthony, Inc., Sylmar, CA (US)

(72) Inventors: Mark Sandnes, Granada Hills, CA (US); Jeffery W. Nicholson, Palmdale, CA (US); David Briggs Baugh, Palmdale, CA (US); Juan Francisco Flores Rivera, Sylmar, CA (US); Pedro Almaguer, North Hills, CA (US); Matthew Rolek, Valencia, CA (US)

(73) Assignee: Anthony, Inc., Sylmar, CA (US)

( * ) Notice: Subject to any disclaimer, the term of this patent is extended or adjusted under 35 U.S.C. 154(b) by 0 days.

(21) Appl. No.: 18/001,457

(22) PCT Filed: Jun. 8, 2021

(86) PCT No.: PCT/US2021/036413
§ 371 (c)(1),
(2) Date: Dec. 9, 2022

(87) PCT Pub. No.: WO2021/252497
PCT Pub. Date: Dec. 16, 2021

(65) Prior Publication Data
US 2023/0225065 A1  Jul. 13, 2023

Related U.S. Application Data

(60) Provisional application No. 63/036,802, filed on Jun. 9, 2020.

(51) Int. Cl.
*E05D 7/10* (2006.01)
*A47F 3/04* (2006.01)
(Continued)

(52) U.S. Cl.
CPC ........... *H05K 5/0226* (2013.01); *A47F 3/043* (2013.01); *E05D 3/02* (2013.01); *E05D 7/1044* (2013.01);
(Continued)

(58) Field of Classification Search
CPC ...... E05D 7/1044; A47F 3/043; A47F 3/0434; F25D 23/02; F25D 23/028
See application file for complete search history.

(56) References Cited

U.S. PATENT DOCUMENTS 4,715,090 A * 12/1987 Morris ................. E05D 7/1044
16/261
7,603,746 B1 * 10/2009 von Resch ................ E05D 7/04
16/265
(Continued)

FOREIGN PATENT DOCUMENTS

WO   WO 2019/032893   2/2019
WO   WO 2020/131881   6/2020
WO   WO 2021/150406   7/2021

OTHER PUBLICATIONS

[No Author Listed], ".093/(2.36) Housings, Plug and Receptacle, 12 CKT, .198/(5.03)CTR," Molex, Nov. 13, 2014, 2 pages.
(Continued)

*Primary Examiner* — Janet M Wilkens
*Assistant Examiner* — Susan M. Heschel
(74) *Attorney, Agent, or Firm* — Fish & Richardson P.C.

(57) ABSTRACT

In one general aspect, the subject matter described in this specification can be embodied in a display case door that includes an insulated panel assembly that is transparent to visible light. The door further includes a door frame extending about and secured to a peripheral edge of the insulated panel assembly, an electronic display overlaying the insulated panel assembly, and at least one lift-off hinge including
(Continued)

a first hinge component attached to a longitudinal side of the door frame, and a second hinge component coupled to the electronic display.

22 Claims, 5 Drawing Sheets

(51) Int. Cl.
  *E05D 3/02* (2006.01)
  *G09F 9/30* (2006.01)
  *G09F 23/06* (2006.01)
  *H05K 5/02* (2006.01)
  *H05K 5/03* (2006.01)
  *G09F 23/00* (2006.01)

(52) U.S. Cl.
  CPC .............. *G09F 9/30* (2013.01); *G09F 23/06* (2013.01); *H05K 5/0247* (2013.01); *H05K 5/03* (2013.01); *E05Y 2900/202* (2013.01); *E05Y 2900/31* (2013.01); *G09F 2023/0033* (2013.01)

(56) References Cited

U.S. PATENT DOCUMENTS

| | | | | |
|---|---|---|---|---|
| 7,921,514 | B2* | 4/2011 | Anillo Crespo | E05D 7/1044 |
| | | | | 16/374 |
| 9,052,536 | B2* | 6/2015 | Artwohl | A47F 10/02 |
| 9,309,704 | B2* | 4/2016 | Gouge | E05D 5/14 |
| 10,378,257 | B2* | 8/2019 | Witting | F16B 37/00 |
| 10,580,333 | B2* | 3/2020 | Artwohl | A47F 3/001 |
| 10,588,429 | B2* | 3/2020 | Bates | F25D 11/00 |
| 10,670,329 | B2* | 6/2020 | Kang | F25D 23/028 |
| 2006/0156512 | A1* | 7/2006 | Naylor | E05D 5/128 |
| | | | | 16/273 |
| 2006/0273621 | A1* | 12/2006 | Shaw | E05D 7/121 |
| | | | | 296/146.11 |
| 2013/0283567 | A1* | 10/2013 | Yamaguchi | E05D 3/02 |
| | | | | 16/260 |
| 2016/0123654 | A1 | 5/2016 | Lee et al. | |
| 2016/0153221 | A1 | 6/2016 | Dodge et al. | |
| 2019/0050900 | A1 | 2/2019 | Avakian | |
| 2019/0122263 | A1 | 4/2019 | Avakian | |
| 2019/0221144 | A1 | 6/2019 | Anthony | |
| 2019/0208925 | A1* | 7/2019 | Kim | F25D 27/00 |
| 2020/0256612 | A1 | 8/2020 | Avakian et al. | |
| 2020/0300538 | A1 | 9/2020 | Avakian et al. | |
| 2021/0041161 | A1 | 2/2021 | Avakian | |
| 2021/0366005 | A1 | 11/2021 | Avakian et al. | |

OTHER PUBLICATIONS

International Preliminary Report on Patentability in International Appln. No. PCT/US2021/036413, dated Dec. 22, 2022, 12 pages.
Invitation to Pay Additional Fees in International Appln. No. PCT/US2021/036413, dated Aug. 17, 2021, 2 pages.
International Search Report and Written Opinion in related International Application No. PCT/US2021/036413, dated Oct. 26, 2021, 15 pages.
Hingeoutlet.com [online], "Heavy Duty Weld on Barrel Hinge—7 Inches—King Kong—Up to 3000 Lbs Per Pair—2 Pack," available on or before Mar. 27, 2023, via Internet Archive: Wayback Machine URL <https://www.hingeoutlet.com/collections/heavy-duty-badass-hinges-weld-on-and-bolt-on/products/heavy-duty-weld-on-barrel-hinge-7-inches-king-kong-up-to-3000-lbs-per-pair-sold-in-pairs>, retrieved on Jan. 25, 2024, URL<https://www.hingeoutlet.com/collections/heavy-duty-badass-hinges-weld-on-and-bolt-on/products/heavy-duty-weld-on-barrel-hinge-7-inches-king-kong-up-to-3000-1bs-per-pair-sold-in-pairs>, 3 pages.

* cited by examiner

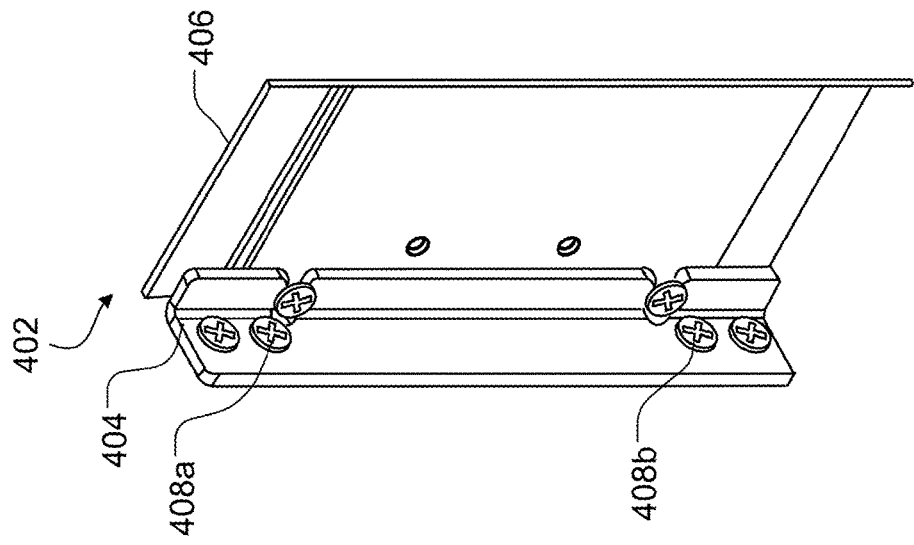
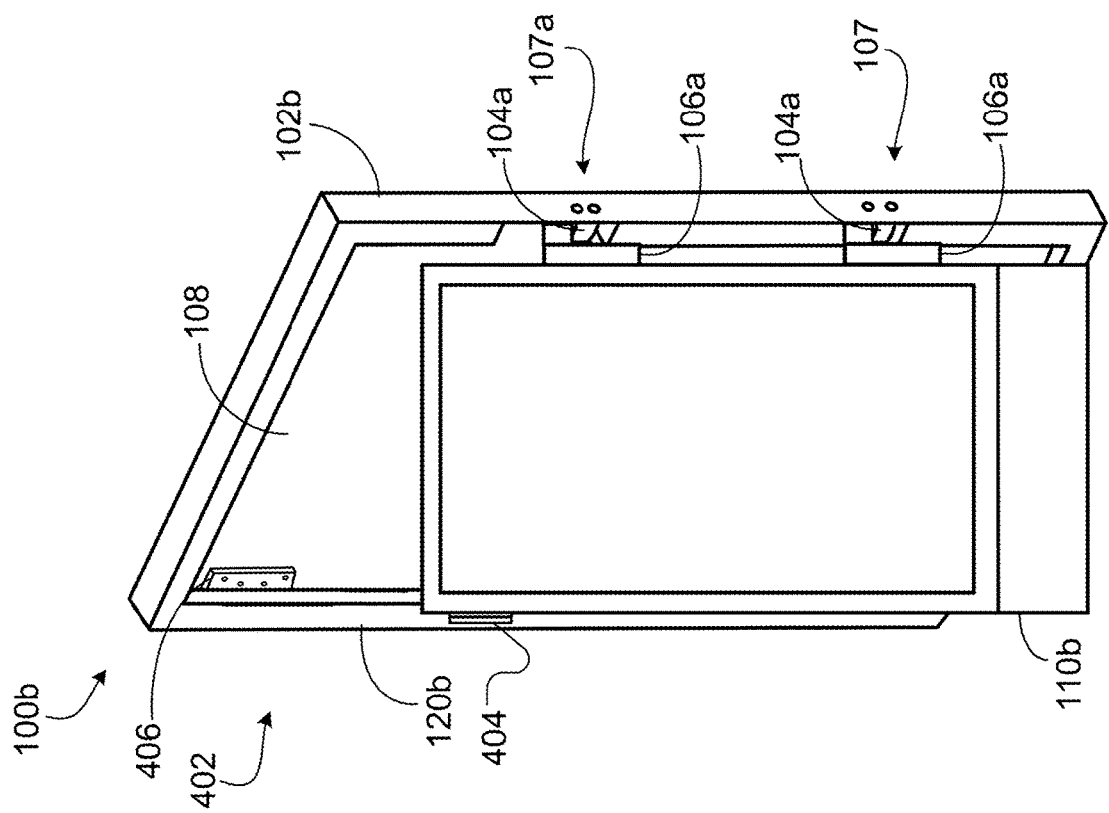

DOOR FOR MOUNTING A REMOVABLE ELECTRONIC DISPLAY

CROSS REFERENCE TO RELATED APPLICATIONS

This application is a U.S. National Stage Application under 35 U.S.C. § 371 and claims the benefit of International Patent Application No. PCT/US2021/036413, filed on Jun. 8, 2021, which claims the benefit of priority to U.S. Provisional Patent Application No. 63/036,802, filed on Jun. 9, 2020.

TECHNICAL FIELD

This invention relates to thermally insulated doors for temperature-controlled enclosures.

BACKGROUND

Refrigerated enclosures are used in commercial, institutional, and residential applications for storing and/or displaying refrigerated or frozen objects. Refrigerated enclosures may be maintained at temperatures above freezing (e.g., a refrigerator) or at temperatures below freezing (e.g., a freezer). Refrigerated enclosures have one or more thermally insulated doors or windows for viewing and accessing refrigerated or frozen objects within a temperature-controlled space. Doors for refrigerated enclosures generally include thermally insulated glass panel assemblies.

SUMMARY

The present disclosure relates to an electronic display for a display case door for a refrigerated enclosure.

Implementations of the present disclosure include a display case door including an insulated panel assembly, a door frame, an electronic display, a lift-off hinge, a first cover bezel coupled to a front surface of the door frame, the first cover bezel sized to overlay the front surface of the door frame and at least a portion of the lift-off hinge; a circuitry module, a power cable, and a second cover bezel. The insulated panel assembly is transparent to visible light. The door frame extends about and is secured to a peripheral edge of the insulated panel assembly. The electronic display is mounted to the door frame by the lift-off hinge. The lift-off hinge includes a first hinge component and a second hinge component. The first hinge component is attached to a longitudinal side of the door frame. The second hinge component is coupled to the electronic display. One of the first hinge component and the second hinge component includes a pin and the other of the first hinge component and the second hinge component includes a hinge knuckle. The hinge knuckle defines a channel sized to receive the pin, thereby, coupling the electronic display to the door frame. The first cover bezel is coupled to a front surface of the door frame. The first cover bezel is sized to overlay the front surface of the door frame and at least a portion of the lift-off hinge. The circuitry module is positioned in a bottom portion of the door frame and overlays a portion of the insulated panel assembly. The circuitry module is releasably coupled to the door frame. The circuitry module includes a media player in electronic communication with the electronic display. The media player is configured to control media content presented on the electronic display. The power cable is disposed within a channel in a portion of the door frame. The power cable electrically connects to the electronic display and to the media player. The second cover bezel is coupled to the door frame and covers the circuitry module. The second bezel cover includes a plurality of louvers configured to provide cooling air-flow to the media player.

In some implementations, the second hinge component includes a second leaf and a pin and the first hinge component includes a first leaf and a knuckle configured to receive the pin of the second hinge component.

In some implementations, the pin extends from a downward facing surface of the second leaf with respect to the door and the knuckle defines a channel extending from an upward facing surface of the first leaf with respect to the door. The downward facing surface rests on the upward facing surface with the pin inserted on the channel.

In some implementations, the door frame includes a second lift-off hinge attached at another location on the longitudinal side of the door frame and the electronic display includes a fourth lift-off hinge component including a hinge knuckle configured to receive a pin of the other of the third lift-off hinge component and the fourth lift-off hinge component to rotatably and releasably secure the electronic display to the door frame.

In some implementations, the display case door includes a latch secured to a second edge of the electronic display opposite the edge of the electronic display. The door frame includes a latch receptacle attached to a second longitudinal side of the door frame opposite the first side. The latch receptacle is configured to engage the latch.

In some implementations, the display case door includes a mounting block mechanically attached to the edge of the electronic display. The second hinge component is mechanically attached to the mounting block.

In some implementations, the display case door includes a switch secured to the electronic display. The switch includes a device to turn on or off the power to the electronic display.

In some implementations, the display case door includes a quick disconnect plug. The quick disconnect plug is attached to the control and power cables providing power, ground, and video to the electronic display.

In some implementations, the display case door includes a power cable. The power cable includes at least a power supply cable, a ground cable, and a detachable ground lug.

Further implementations of the present disclosure include a display case door including a display case door including an insulated panel assembly, a door frame, an electronic display, and a lift-off hinge. The door frame extends about and is secured to a peripheral edge of the insulated panel assembly. The electronic display is mounted to the door frame by the lift-off hinge. The lift-off hinge includes a first hinge component and a second hinge component. The first hinge component is attached to a longitudinal side of the door frame. The second hinge component is coupled to the electronic display. One of the first hinge component and the second hinge component include a pin, and the other of the first hinge component and the second hinge component include a hinge knuckle that defines a channel sized to receive the pin, thereby, coupling the electronic display to the door frame.

Further implementations of the present disclosure include a display case door including an insulated panel assembly, a door frame, an electronic display, at least one spacer plate, a mounting bracket, a first cover bezel, a circuitry module, a power cable, and a second cover bezel. The insulated panel assembly is transparent to visible light. The door frame extends about and secured to a peripheral edge of the insulated panel assembly. The electronic display overlays a majority of the insulated panel assembly. At least one spacer plate is coupled to an edge of the electronic display. The mounting bracket is secured to the door frame and has a coupling end releasably attached to the at least one spacer plate to releasably secure the electronic display to the door frame. The first cover bezel is coupled to a front surface of the door frame. The first cover bezel is sized to overlay the front surface of the door frame, the mounting bracket, and at least one spacer plate. The circuitry module is positioned in a bottom portion of the door frame and overlays a portion of the insulated panel assembly. The circuitry module is releasably coupled to the door frame. The circuitry module comprises a media player in electronic communication with the electronic display. The media player is configured to control media content presented on the electronic display. The power cable is disposed within a channel in a portion of the door frame. The power cable is electrically connected to the electronic display and to the media player. The second cover bezel is coupled to the door frame and covers the circuitry module. The second bezel cover comprises a plurality of louvers configured to provide cooling air-flow to the media player.

Further implementations of the present disclosure include a display case door including an insulated panel assembly, a door frame, an electronic display overlaying the insulated panel assembly, at least one spacer plate, and a mounting bracket. The insulated panel assembly is transparent to visible light. The door frame extends about and is secured to a peripheral edge of the insulated panel assembly. The electronic display overlays the insulated panel assembly. At least one spacer plate is coupled to an edge of the electronic display. The mounting bracket is secured to the door frame and has a coupling end releasably attached to the at least one spacer plate to releasably secure the electronic display to the door frame.

Particular implementations of the subject matter described in this specification can be implemented so as to realize one or more of the following advantages.

Implementations of the present disclosure may improve the maintainability of electronic displays mounted to a display case door. For example, implementations of the present disclosure may provide for easy replacement or maintenance of electronic displays mounted to a display case door without the need to remove an entire display case door. For example, two people can safely lift and replace the electronic display without placing uneven shear loading on screws and bracket threads. Additionally, implementations of the present disclosure may provide for simplified local power controls using a reset button on the power module. Implementations of the present disclosure may also provide improved control of normal on/off power cycles from inadvertent customer or user action. Implementations of the present disclosure may simplify display case door removal and increase the safety of the operation by using a quick disconnect power connection. Implementations of the present disclosure may allow the same display can accommodate different door sizes. Implementations of the present may allow for the maintenance of cameras or other small electrical components by only one person.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 4A is a schematic perspective view of an exemplary electronic display case door according to a second implementation of the present disclosure.

FIG. 4B is a perspective view of a latch of the electronic display case door of FIG. 4B.

DETAILED DESCRIPTION

Figure 1:
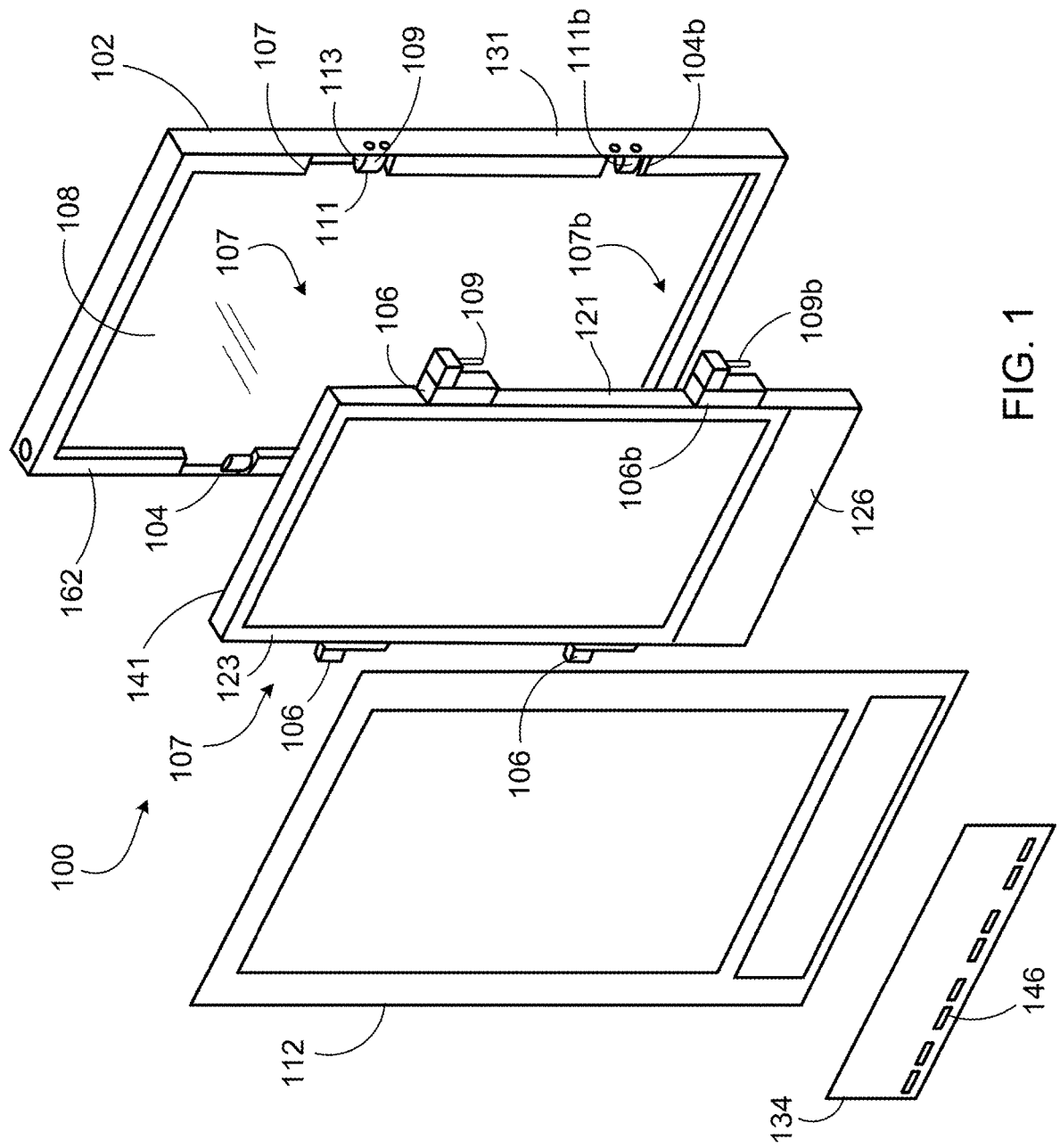
FIG. 1 is an exploded perspective view of an exemplary electronic display case door according to a first implementation of the present disclosure.

FIG. 1 is an exploded perspective view of an exemplary arrangement of an electronic display 110 in a display case door 100 according to implementations of the present disclosure. FIG. 1 illustrates an exemplary display case door 100 that can be installed in a refrigerated display case such as a refrigerator, a freezer, or other enclosure defining a temperature-controlled space. Display case door 100 includes an insulated panel assembly 108 or transparent panel, a door frame 102 secured to an edge of panel assembly 108, and a cover 112 (e.g., an opaque bezel cover). The display case door also includes an opaque display screen 110 (e.g., an electronic display) coupled to door frame 102 and overlaying panel assembly 108. Electronic display 110 can be mounted to door frame 102 so as to overlay a majority of insulated panel assembly 108.

Electronic display 110 can be secured to or mounted on door frame 102 by at least one lift-off hinge 107. Each lift-off hinge 107 is attached to a housing 141 of electronic display 110 and to door frame 102. For example, lift-off hinges 107 includes a first hinge component 104 coupled to a longitudinal side 131 of door frame 102 and a second hinge component 106 attached to electronic display 110. Second hinge component 106 can include a pin 109 and first hinge component 104 can include a hinge knuckle 111 that defines a channel or hole 113 sized to receive pin 109 to releasably and rotationally secure electronic display 110 to door frame 102.

Electronic display 110 can have two or more lift-off hinges 107 on a first longitudinal side 121 and two or more lift-off hinges 107 on an opposite longitudinal side 123. A second lift-off hinge 107b can be attached at another location (e.g., at a lower vertical elevation) of longitudinal side 131 of door frame 102. The second lift-off hinge 107b includes a hinge component 104b attached to first longitudinal side 131 of door frame 102 and a fourth hinge component 106b attached to first longitudinal side 121 of electronic display 110. The third hinge component 104b has a hinge knuckle or receptacle 111b that receives a pin 109b of fourth hinge component 106b to rotatably and releasably secure electronic display 110 to door frame 102.

Either one of first hinge component 104 or second hinge component 106 can include pin 109, and the other one of the first hinge component 104 or second hinge component 104 can include hinge knuckle 111. Thus, door frame 102 can have multiple 'mounting sites' arranged along the two longitudinal sides of door frame 102 that interface with pins 109 of electronic display 110. Door frame 102 can be arranged such that, when electronic display 110 is mounted, electronic display 110 overlays a majority of insulated panel assembly 108.

Figure 2:
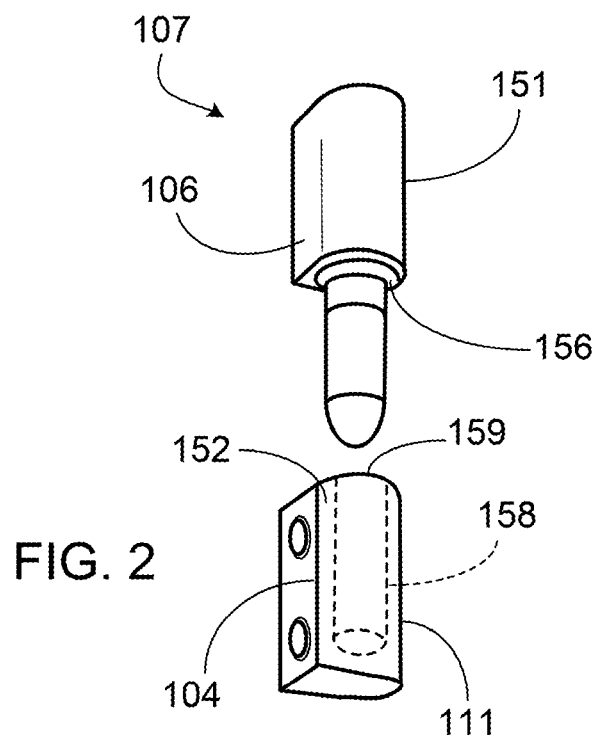
FIG. 2 is a perspective view of a lift-off hinge of the electronic display case door of FIG. 1.

Referring also to FIG. 2, second hinge component 106 of lift-off hinge 107 includes pin 109 extending from a leaf 151 that is affixed to a side edge of housing 141 of electronic display 110. First hinge component 104 includes hinge knuckle 111 extending from a second leaf 152 that is affixed to an internal surface of door frame 102. Specifically, pin 109 extends from a downward facing surface 156 of leaf 151 and knuckle 111 defines a channel 158 extending from an upward facing surface 159 of leaf 152 such that downward facing surface 156 rests on upward facing surface 159 when pin 109 is disposed within channel 158.

In some implementations, pin 109 can extend from housing 141 of electronic display 110 without leaf 151. Similarly, hinge knuckle 111 can extend from door frame 102 without second leaf 152. Each first hinge component 106 can be attached to electronic display 110 by welding, adhering, or by using mechanical fasteners (e.g., screws or bolts). Each second hinge component 104 can be similarly attached to door frame 102. Lift-off hinges 107 can be made of metal or hard plastic.

Referring back to FIG. 1, cover bezel 112 is coupled to a front surface 162 of door frame 102 or to a front surface of electronic display 110 or both. Cover bezel 112 is sized to overlay front surface 162 of door frame 102 and at least a portion of lift-off hinge 107. Cover bezel 112 can also overlay the front surface of housing 141 of electronic display 110.

Display case door 100 can also include a circuitry module 126 disposed underneath electronic display 110. Circuitry module 126 is positioned in a bottom portion of doorframe 102. Circuitry module 126 overlays a portion of insulated panel assembly 108. Circuitry module 126 can be attached to electronic display 110 such that, with electronic display 110 releasably coupled to door frame 102, circuitry module 126 is releasably coupled to door frame 102. As further described in detail below with respect to FIG. 5A, circuitry module 126 includes a media player in electronic communication with electronic display 110 to control media content presented on electronic display 110.

Display case door 100 can also include a second cover bezel 134 coupled to door frame 102 to cover circuitry module 126. Second cover bezel 134 has multiple louvers 146 that provide cooling air-flow to media player and other electronic components of circuitry module 126.

Panel assembly 108 can include one or more panes of glass. In some implementations, panel assembly 108 includes two or more layers of transparent panes bounding a sealed space in between, forming a sealed glass unit (SGU). Door frame 102 extends around and is secured to a peripheral edge of panel assembly 108. As further described in detail below with respect to FIGS. 2 and 4, door frame 102 defines a channel or tunnel that receives one or more power cables that provide electrical power to the electronic display 110.

Display case door 100 can include one or more electronic displays 110. For example, display case door 100 can include two or more electronic displays vertically stacked and together covering the panel assembly 108. Electronic display 110 can include, but is not limited to, a liquid crystal display (LCD), a light emitting diode (LED) display, an organic light emitting diode (OLED) display, a field emission display (FED), a plasma display panel (PDP), or an electroluminescent (EL) display. For example, electronic display 110 can be a smart television with streaming capabilities for receiving content over a wireless network (e.g., a Wi-Fi network).

Door frame 102 has a width and thickness that allows display case door 100 to be installed and operated in an existing refrigerated display case without the need of retrofitting the display case. Door 100 can be operated with or without electronic display 110.

Figure 3:
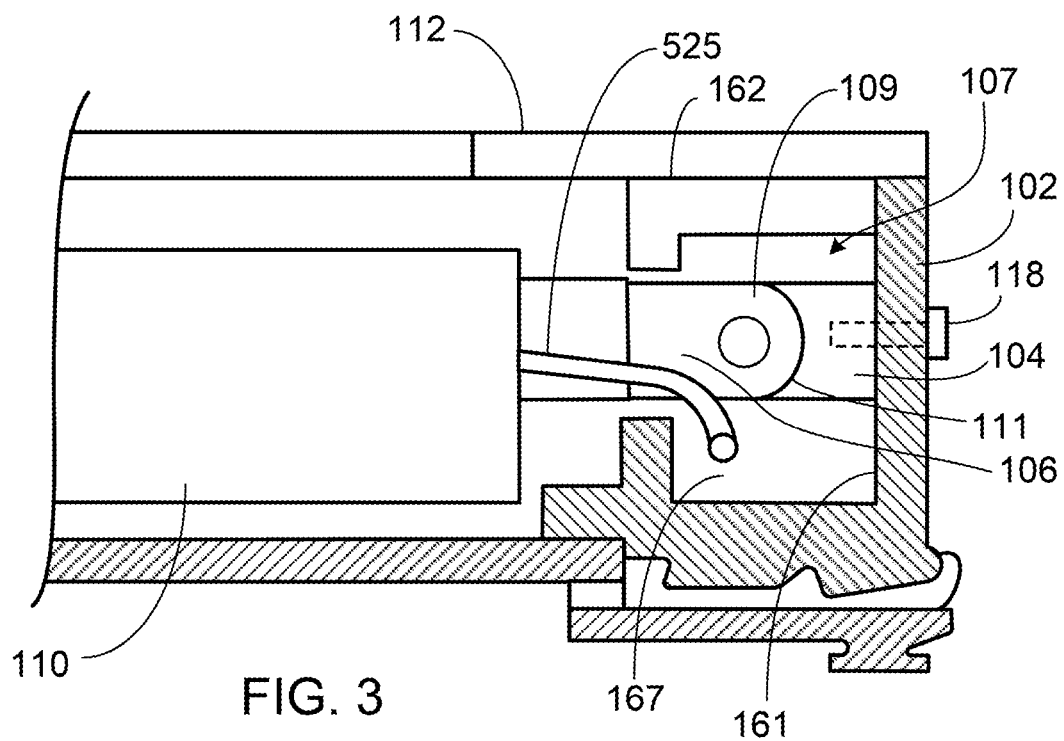
FIG. 3 is a schematic, cross-sectional view of a portion of the electronic display case door of FIG. 1, showing a lift-off hinge.

FIG. 3 is a cross-sectional view of a portion of display case door 100 with electronic display 110 mounted to door frame 102. Lift-off hinge 107 is arranged such that mounting electronic display 110 to door frame 102 (or removing electronic display 110 from door frame 102) does not require removing second hinge component 106 from electronic display 110 or removing first hinge component 104 from door frame 102. Specifically, lift-off hinge 107 is arranged such that mounting electronic display 110 includes inserting pin 109 of second hinge component 106 on hinge knuckle 111 of first hinge component 104 to rest second hinge component 106 on first hinge component 104. Similarly, removing electronic display 110 includes lifting inserted pin 109 from the hinge knuckle 111 by lifting electronic display 110 with respect to frame 102.

First hinge component 106 extends from side edge of electronic display 110 to interface with second hinge component 104. A mechanical fastener 118 secures second hinge component 104 to an internal surface 161 of an internal channel 167 of door frame 102. Thus, at least a portion of lift-off hinge 107 is disposed within internal channel 167 of door frame 102. Internal channel 167 also houses a portion of a power cable 525 disposed within channel 167. Power cable 325 is electrically connected to electronic display 110 and to the media player. Bezel cover 112 can be attached with a mechanical fastener (not shown) to front surface 162 of door frame 102.

FIG. 4A illustrates an exemplary display case door 100*b* with an electronic display 110*b* rotationally mounted on a door frame 102*b* of display case door 100*b*. Electronic display 110*b* includes two lift-off hinges 107 attached to the longitudinal side of electronic display 110*b*. The opposite longitudinal side of electronic display 110*b* has no lift-off hinges 107. This configuration allows electronic display 110*b* to rotate about an axis of the two lift-off hinges 107.

Electronic display 110*b* can be secured to door frame 102*b* by a latch assembly 402. For example, electronic display 110*b* is secured to door frame 102*b* on an opposite side of lift-off hinges 107 by latch assembly 402. Referring also to FIG. 4B, latch assembly 402 includes a first latch component 404 mechanically coupled to door frame 102*b* and a second latch component 406 mechanically coupled to electronic display 110*b*. The first latch component 404 can be mechanically coupled to door frame 102*b* and a second latch component 406 can be mechanically coupled to electronic display 110*b* by a fastener. For example, a multiple screws 408 can mechanically couple the first latch component 404 to door frame 102*b* and a second latch component 406 to electronic display 110*b*. The second latch component 406 can include a latch and first latch component 404 can include a latch receptacle that receives and engages with the latch. The first latch component 404 can be mechanically coupled to the second latch component by a fastener 410. For example, fastener 410 can be a screw.

Figure 5B:
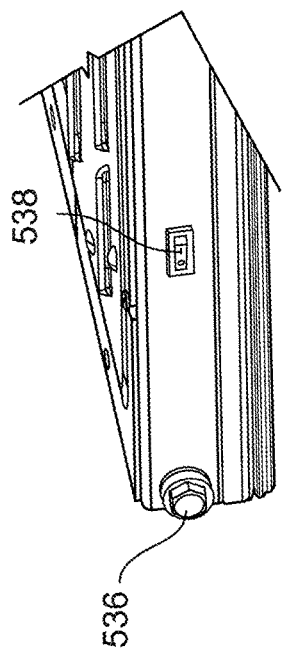
FIG. 5B is a schematic top view of a portion of the display case door of FIG. 5A.
Figure 5A:
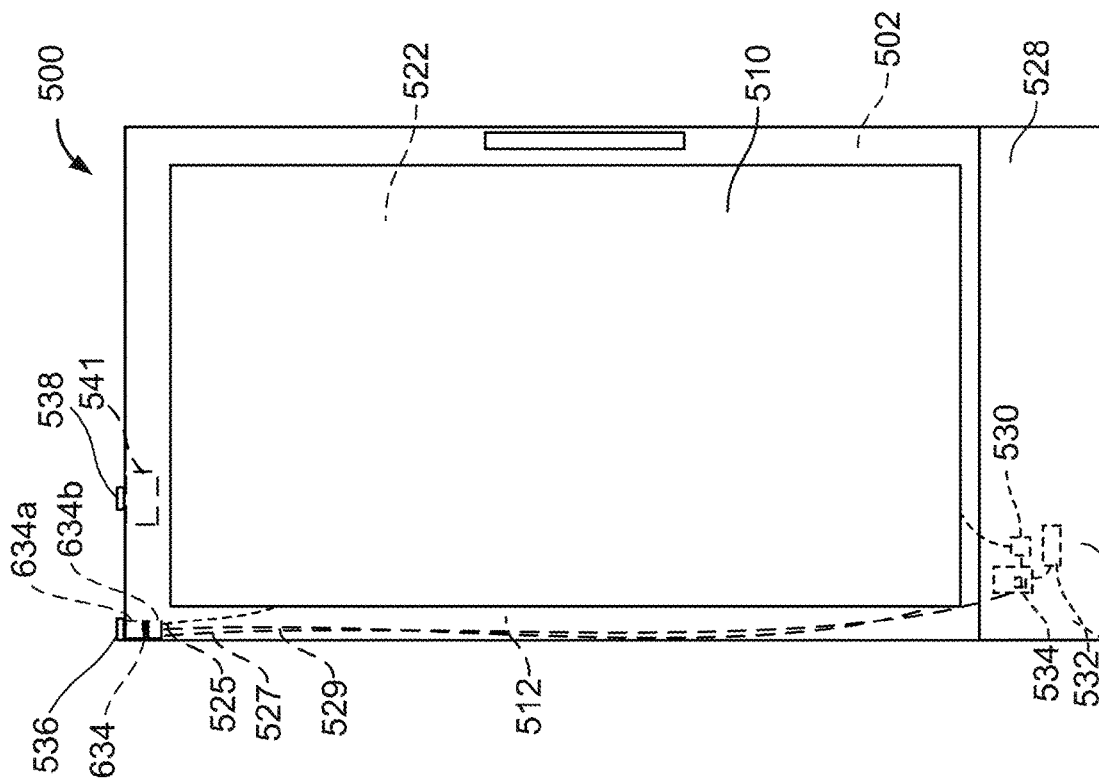
FIG. 5A is a schematic front view of the exemplary display case door according to a third implementation of the present disclosure.

FIG. 5A illustrates an exemplary display case door 500 according to an implementation of the present disclosure. Display case door 500 includes quick disconnect plug 634 and a detachable ground lug 536. Quick disconnect plug 634 is electrically coupled to a power cable 525, a ground wire 527, and one or more electrical wires 529 coupled to electronic display 510 or to circuitry module 526. In some implementations, power cable 525 includes at least a power supply cable, a ground cable, and a detachable ground lug in one wiring assembly with one plug on each end of the wiring assembly. For example, the electronic display 110b will have a male component while the door frame 102b will have the female component. The male component and the female component can be referred to as a pin and socket connection. The plug will have all the power, ground and neutral joined at the plug.

Similar to the display case door shown in FIGS. 1 and 4A, display case door 500 includes a transparent panel assembly 522 and a door frame 502 that receives and secures an electronic display 510 to cover transparent panel assembly 522. Electronic display 510 can be attached to door frame 502 using lift-off hinges (see FIGS. 1 and 4A) or, as further described in detail below with respect to FIG. 6, using mounting brackets. Electronic display 510 has a height that is less than the interior height of frame 502, leaving a space 528 between the bottom of door 500 and the bottom edge of the electronic display 510 to place electrical components with door 500. For example, display case door 500 includes circuitry module 526 disposed under the electronic display 510. Circuitry module 526 includes at least a media player 530 in electronic communication with electronic display 510. Media player 530 controls media content presented on display 510. Circuitry module 526 can also include a power hub 532 and a power converter 526. Circuitry module 526 is releasably coupled to door frame 502.

Circuitry module 526 can include one or more quick disconnect plugs 534. A quick disconnect plug 534 is attached to the first end of a control cable. Quick disconnect plug 534 is also attached to a power cable 529. Quick disconnect plug 534 may include a power, audio, visual, or ground wire.

Referring also to FIG. 5B, display case door 500 includes a switch 538 secured to door frame 512. Switch 538 is coupled to an electronic device 541 electrically coupled to electronic display 510 to turn on and off the power to electronic display 510. Power switch 538 resides on top of door frame 512 and can be in line with power cable 525. Power switch 536 resides on door frame 512 to prevent customers or maintainers from inadvertently cycling power to display case door 500. Switch 538 can also reside inside circuitry module 526, with a small opening at the bezel cover for a probe to be inserted to actuate switch 538.

Power cables 525 can provide electrical power to electronic display 510 and power converter 534. Power converter 534 receives alternating current (AC) power from power cable 525 and converts the AC power to direct current (DC) power. For example, power converter 534 converts 110V AC power to 5V DC power. Power converter 534 is electrically connected to one or more media players 530. Power converter 534 is arranged inside display case door 500.

Figure 6:
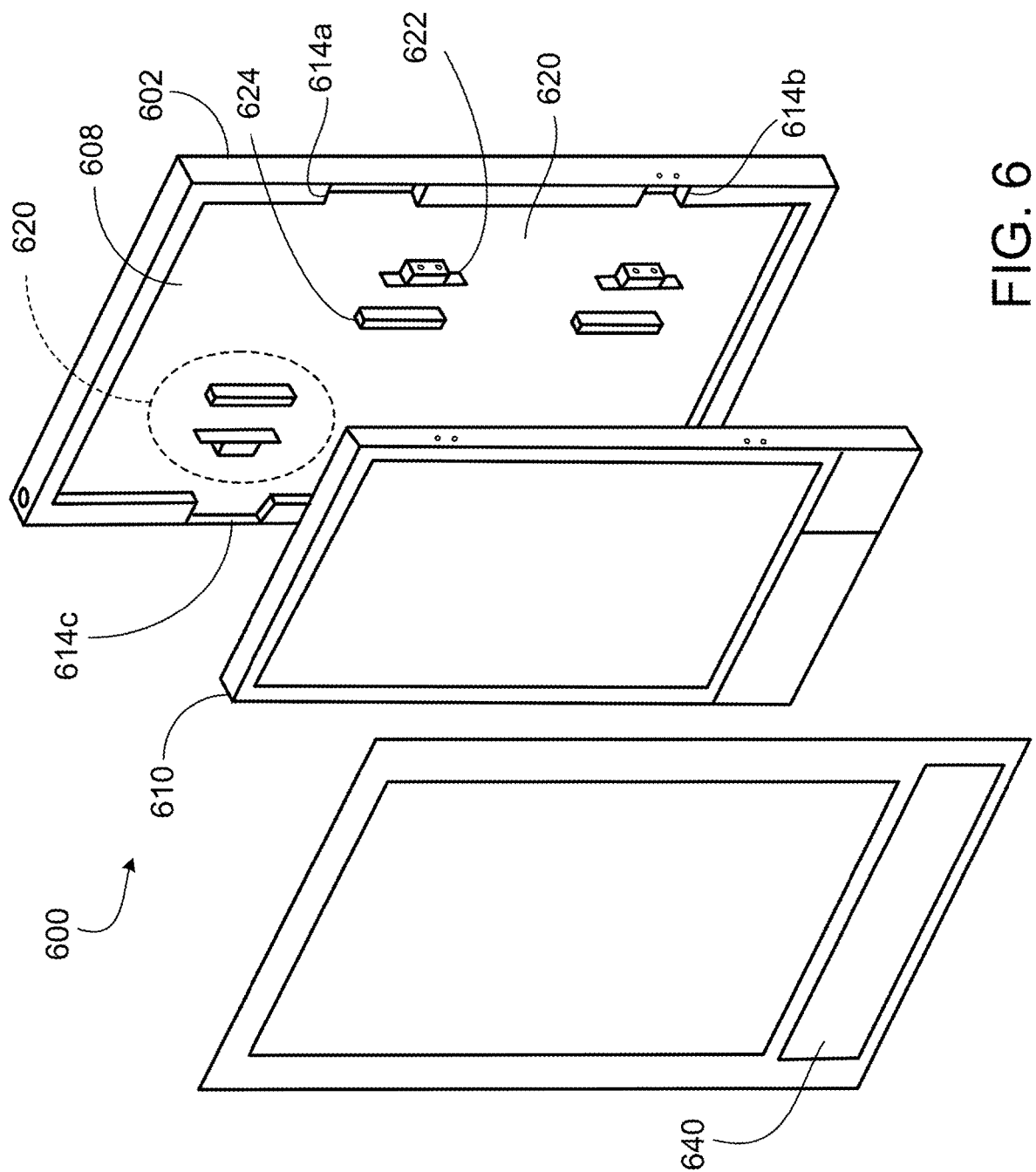
FIG. 6 is an exploded view of an exemplary electronic display case door according to a fourth implementation of the present disclosure.

FIG. 6 illustrates an exemplary display case door 600 according to another implementation of the present disclosure. Display case door 600 has bracket assemblies 620 that releasably secure electronic display 610 to door frame 602 of display case door 600. Each bracket assembly 620 can include a spacer plate or mounting block 624 and a bracket 622. Spacer plate 624 is attached to the longitudinal side of electronic display 610 and bracket 622 is secured to spacer plate 624. Bracket 622 has an end that extends away from spacer plate 624 to interface with door frame 602. Each bracket 622 interfaces with door frame 602 at a respective mounting site 614a, 614b and 614c of door frame 602 to secure electronic display 610 to door frame 602. The spacer plate 624 can vary in size depending on the size of the door and the electronic display 610. For example, the spacer place 624 can be one inch, three inches, four and one half inches, or six inches.

Spacer plate or mounting block 624 can also be used with hinge assembly 107 (see FIG. 1) to increase a distance between the door frame and the electronic display. For example, the mounting block can be mechanically attached to the edge of the electronic display and the second hinge component can be mechanically attached to the mounting block.

While a number of examples have been described for illustration purposes, the foregoing description is not intended to limit the scope of the invention, which is defined by the scope of the appended claims. There are and will be other examples and modifications within the scope of the following claims. Furthermore, one of skill in the art would appreciate that features described in reference to a specific embodiment are not limited to that embodiment and can be interchanged with features of other embodiments.

What is claimed is:

1. A display case door comprising:
an insulated panel;
a door frame housing the insulated panel, the door frame comprising a first vertical surface and a second vertical surface opposite the first vertical surface;
an electronic display mounted internally to the door frame by:
a hinge coupled to the first vertical surface of the door frame and a first longitudinal side of the electronic display, the hinge comprising:
a first hinge component attached to a first member of the door frame that extends inwards from the first vertical surface of the door frame towards a center region of the display case door, wherein the first hinge component comprises a first leaf, and
a second hinge component coupled to the first longitudinal side of the electronic display, wherein the second hinge component comprises a second leaf, wherein the second hinge component is coupled to the first hinge component by a pin; and
a latch assembly coupling the electronic display to the second vertical surface of the door frame, the latch assembly an L-shaped retainer with a first flange forming an angle with a second flange, the first flange coupled to a second longitudinal side of the electronic display, opposite the first longitudinal side, and the second flange coupled to a second member of the door frame extending from the second vertical surface inwards towards the center region by a distance sufficient to mate with the second flange of the L-shaped retainer;
a circuitry module positioned in a bottom portion of the door frame and overlaying a portion of the insulated panel, the circuitry module positioned adjacent to a bottom edge of the electronic display, and the circuitry module comprising a media player in electronic communication with the electronic display, the media player configured to control media content presented on the electronic display;
a power cable disposed within a channel in a portion of the door frame, the power cable electrically connected to the electronic display and to the media player; and a cover bezel coupled to the door frame and covering the circuitry module, the cover bezel comprising a plurality of louvers configured to provide cooling air-flow to the media player.

2. The display case door of claim 1, further comprising a second hinge comprising: a third hinge component attached at another location on the first vertical surface of the door frame and a fourth hinge component coupled to the first longitudinal side of the electronic display.

3. The display case door of claim 1, wherein the first member comprises a mounting block mechanically attached between the first hinge component and the door frame.

4. The display case door of claim 1, further comprising a switch mounted to the door frame, wherein the switch is configured to turn on or off power to the electronic display.

5. The display case door of claim 1, further comprising a quick disconnect plug, wherein the quick disconnect plug is attached to control and power cables providing power and video data to the electronic display.

6. The display case door of claim 1, wherein the insulated panel is transparent to visible light.

7. The display case door of claim 1, wherein the first flange of the L-shaped retainer comprises a slot extending from an outer edge inward, the slot sized to accept a mechanical fastener.

8. The display case door of claim 1, wherein the first flange of the L-shaped retainer is longer than the second flange of the L-shaped retainer, and
wherein the second flange of the L-shaped retainer comprises at least one open ended slot extending from an outer edge inward, the slot sized to accept a mechanical fastener.

9. A display case door comprising:
an insulated panel;
a door frame comprising a first longitudinal side and a second longitudinal side, the door frame housing the insulated panel; and
an electronic display mounted to the door frame by a hinge and retained in place by a retainer assembly, the hinge comprising:
  a first hinge component attached to a frame member that extends inward from the first longitudinal side of the door frame towards a center region of the display case door, wherein the first hinge component comprises a first leaf, and
  a second hinge component coupled to a first edge of the electronic display, wherein the second hinge component comprises a second leaf, wherein the second hinge component is coupled to the first hinge component by a pin, thereby, coupling the electronic display to the door frame; and
the retainer assembly comprising:
  at least one L-shaped retainer with a first flange forming an angle with a second flange, the first flange coupled to a frame extension that extends inwards from the second longitudinal side of the door frame towards the center region of the display case door by a distance sufficient to mate with the first flange, and the second flange coupled, by at least one threaded fastener, to a second edge of the electronic display.

10. The display case door of claim 9, further comprising a second hinge comprising: a third hinge component attached at another location on the first longitudinal side of the door frame and a fourth hinge component coupled to the first edge of the electronic display.

11. The display case door of claim 9, wherein the frame member comprises a mounting block mechanically attached between the first hinge component and the door frame.

12. The display case door of claim 9, further comprising a switch mounted to the door frame, wherein the switch is configured to turn on or off power to the electronic display.

13. The display case door of claim 9, further comprising a quick disconnect plug, wherein the quick disconnect plug is attached to control and power cables providing power and video data to the electronic display.

14. The display case door of claim 9, wherein the first second flange of the L-shaped retainer comprises a slot extending from an outer edge inward, the slot sized to accept a mechanical fastener.

15. The display case door of claim 9, wherein the first flange of the L-shaped retainer is shorter than the second flange of the L-shaped retainer, and
wherein the first flange of the L-shaped retainer comprises at least one open ended slot extending from an outer edge inward, the slot sized to accept a mechanical fastener, and
wherein the second flange of the L-shaped retainer comprises a plurality of apertures aligned with screw holes on the second edge of the electronic display.

16. A display case door comprising:
an insulated panel;
a door frame extending about and housing the insulated panel,
an electronic display mounted to the door frame on a pivot attached to a first side edge of the electronic display, the electronic display overlaying a majority of the insulated panel with the electronic display pivoted in front of the insulated panel;
a plurality L-shaped brackets mounted to a second side edge of the electronic display and configured to releasable attach to a frame extension that extends inward from an edge of the door frame towards a center region of the display case door by a distance sufficient to mate with the L-shaped brackets with the electronic display pivoted in front of the insulated panel;
a first cover bezel coupled to a front surface of the door frame, the first cover bezel sized to overlay the front surface of the door frame and the pivot;
a circuitry module positioned in a bottom portion of the door frame and overlaying a portion of the insulated panel, the circuitry module comprising a media player in electronic communication with the electronic display, the media player configured to control media content presented on the electronic display;
a power cable disposed within a channel in a portion of the door frame, the power cable electrically connected to the electronic display and to the media player; and
a second cover bezel coupled to the door frame and covering the circuitry module, the second cover bezel comprising a plurality of louvers configured to provide cooling air-flow to the media player.

17. The display case door of claim 16, further comprising a switch mounted to the door frame, wherein the switch is configured to turn on or off power to the electronic display.

18. The display case door of claim 16, wherein the L-shaped brackets comprise a first flange that is attached to the frame extension, and a second flange that is attached to a side of the electronic display,
wherein the first flange is shorter than the second flange and the first flange comprises at least one open ended slot extending from an outer edge inward.

19. A display case door comprising:
an insulated panel;
a door frame extending about and housing the insulated panel;
an electronic display mounted to the door frame on a pivot attached to a first side edge of the electronic display, the electronic display overlaying a majority of the insulated panel with the electronic display pivoted in front of the insulated panel, wherein the pivot is coupled to a first vertical side of the door frame by a spacer extending from the first vertical side inward towards a center region of the display case door; and
a plurality of L-shaped brackets mounted to a second side edge of the electronic display and configured to releasable attach to mounting sites along a second vertical side of the door frame with the electronic display pivoted in front of the insulated panel, wherein each mounting site comprises a spacer extending from the second vertical side inwards towards the center region by a distance sufficient to mate with a corresponding L-shaped bracket.

20. The display case door of claim 19, further comprising a switch mounted to the door frame, wherein the switch is configured to turn on or off power to the electronic display.

21. The display case door of claim 19, wherein at least one L-shaped bracket comprises slots extending from an outer edge inward, each slot sized to accept a mechanical fastener.

22. The display case door of claim 19, wherein the L-shaped brackets comprise a first flange that is attached to the mounting sites, and a second flange that is attached to a side of the electronic display,
wherein the first flange is shorter than the second flange and the first flange comprises at least one open ended slot extending from an outer edge inward.

* * * * *